United States Patent [19]
Cho

[11] Patent Number: 6,060,726
[45] Date of Patent: May 9, 2000

[54] CMOS TRANSISTOR WITH TWO CHANNEL REGIONS AND COMMON GATE

[75] Inventor: Seok-Won Cho, Chungcheongbuk-do, Rep. of Korea

[73] Assignee: LG Semicon Co., Ltd., Chungcheongbuk-Do, Rep. of Korea

[21] Appl. No.: 09/296,491

[22] Filed: Apr. 22, 1999

Related U.S. Application Data

[62] Division of application No. 08/859,690, May 21, 1997, Pat. No. 5,943,561.

[30] Foreign Application Priority Data

Nov. 8, 1996 [KR] Rep. of Korea .................. 96-52736

[51] Int. Cl.[7] ................................................ H01L 29/78
[52] U.S. Cl. .............................................. 257/69; 257/350
[58] Field of Search ........................... 257/270, 278, 257/365, 366, 350, 351, 401, 69, 393

[56] References Cited

U.S. PATENT DOCUMENTS

| | | | |
|---|---|---|---|
| 4,651,408 | 3/1987 | MacElwee et al. | 29/576 J |
| 4,654,121 | 3/1987 | Miller et al. | 156/653 |
| 4,918,510 | 4/1990 | Pfiester | 357/42 |
| 5,334,861 | 8/1994 | Pfiester et al. | 257/67 |

*Primary Examiner*—David Hardy
*Attorney, Agent, or Firm*—Morgan, Lewis & Bockius LLP

[57] ABSTRACT

A CMOS device includes a first conductivity type semiconductor substrate having an active region, the active region including two second conductivity type of impurity regions and a first channel region between the two second conductivity type impurity regions, a field insulation region on the semiconductor substrate for electrical isolation of the active region from other adjacent active regions, a second conductivity type semiconductor layer on the field insulation layer, the semiconductor layer including two first conductivity type impurity regions and a second channel region between the two first conductivity type impurity regions, and a gate electrode over the first channel region in the active region and the second channel region in the semiconductor layer.

12 Claims, 7 Drawing Sheets

CMOS TRANSISTOR WITH TWO CHANNEL REGIONS AND COMMON GATE

This is a divisional of application Ser. No. 08/859,690, filed on May 21, 1997 now U.S. Pat. No. 5,943,501.

This application claims the benefit of Korean Patent Application No. 52736/1996 filed Nov. 8, 1996, which is hereby incorporated by reference.

BACKGROUND OF THE INVENTION

1. Field of the Invention

The present invention relates to a semiconductor device and, more particularly, to a CMOS transistor and a method of fabricating the same. Although the present invention has a wide range of applications, it is particularly suitable for highly integrated circuits.

2. Discussion of the Related Art

In general, a complementary metal oxide semiconductor (CMOS) transistor has a P channel transistor and an N channel transistor on a substrate. For example, the CMOS transistor used for an SRAM cell is made by forming an NMOS bulk transistor on a substrate and then forming a PMOS thin film transistor thereon. The productivity or yield of the CMOS transistor is low because of its numerous processes. Therefore, there is now required a CMOS transistor allowing high integration with a simple process for an SRAM cell which forms the PMOS transistor serving as a load transistor in the form of a thin film transistor, and the NMOS bulk transistor serving as a drive transistor.

With reference to the attached drawings, a conventional CMOS transistor will be described below.

As illustrated in FIG. 1, a conventional CMOS transistor forms an NMOS bulk transistor by depositing a gate oxide layer 3 and a gate electrode 4 (in this order) on the active region of a substrate 1 electrically isolated by a field insulation layer 2. A silicon oxide layer, as an interlevel insulation layer 5, is deposited on the overall surface of the substrate 1 including the gate electrode 4 of the NMOS bulk transistor. A gate electrode 6 of the PMOS TFT is formed on a predetermined portion of the interlevel insulation layer 5, and a gate oxide layer 7 is formed on the gate electrode 6 of the PMOS TFT. A polysilicon body layer 8 of the PMOS TFT is formed on the gate oxide layer 7 over the gate electrode 6 of the PMOS TFT. A source region 8a and a drain region 8b are formed in both sides of the polysilicon body layer 8 on the gate oxide layer 7.

However, the thus-structured device has a problem in that the process of stacking the PMOS TFT on the NMOS bulk transistor requires too many steps, thereby decreasing its productivity and increasing cost.

SUMMARY OF THE INVENTION

Accordingly, the present invention is directed to a CMOS transistor and a method of fabricating the CMOS transistor that substantially obviates one or more of the problems due to limitations and disadvantages of the related art.

An object of the present invention is to provide a CMOS transistor and a method of fabricating the same suitable for high integration.

Another object of the present invention is to simplify the fabrication process of a CMOS transistor.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a CMOS device includes a first conductivity type semiconductor substrate; an active region and field insulating layer formed on the first conductivity type semiconductor substrate; a second conductivity type semiconductor layer formed on the field insulating layer and surrounding the active region; a gate electrode formed on the active region and second conductivity type semiconductor layer; a second conductivity type impurity region formed on the active region at both sides of the gate electrode; and a first conductivity type impurity region formed on the second conductivity type semiconductor layer at both sides of the gate electrode.

In another aspect, the present invention provides a CMOS device comprising a first conductivity type semiconductor substrate having an active region, the active region including two second conductivity type of impurity regions and a first channel region between the two second conductivity type impurity regions, a field insulation region on the semiconductor substrate for electrical isolation of the active region from other adjacent active regions, a second conductivity type semiconductor layer on the field insulation layer, the semiconductor layer including two first conductivity type impurity regions and a second channel region between the two first conductivity type impurity regions, and a gate electrode over the first channel region in the active region and the second channel region in the semiconductor layer.

In a further aspect, the present invention provides a method of fabricating a CMOS device including the steps of forming an active region and field insulating layer on a first conductivity type semiconductor substrate; forming a second conductivity type semiconductor layer on the field insulating layer to surround the active region; forming a gate oxide layer and a gate electrode on the active region and the field insulating layer; forming a second conductivity type impurity region at both sides of the gate electrode; and forming a first conductivity type impurity region on the second conductivity type semiconductor layer at both sides of the gate electrode.

It is to be understood that both the foregoing general description and the following detailed description are exemplary and explanatory and are intended to provide further explanation is of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

Figure 1:
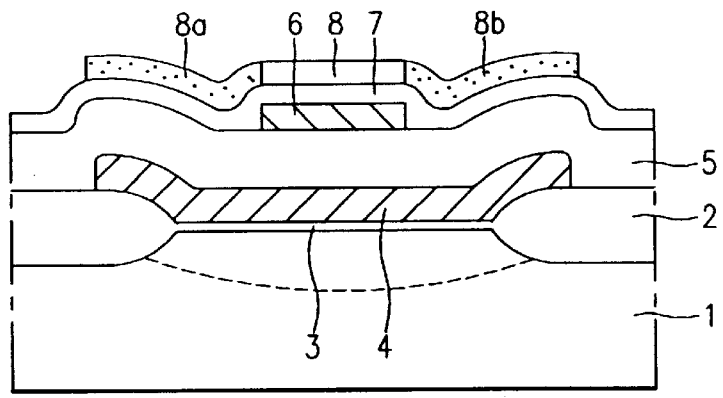
FIG. 1 is a sectional view of a conventional CMOS transistor.
Figure 2:
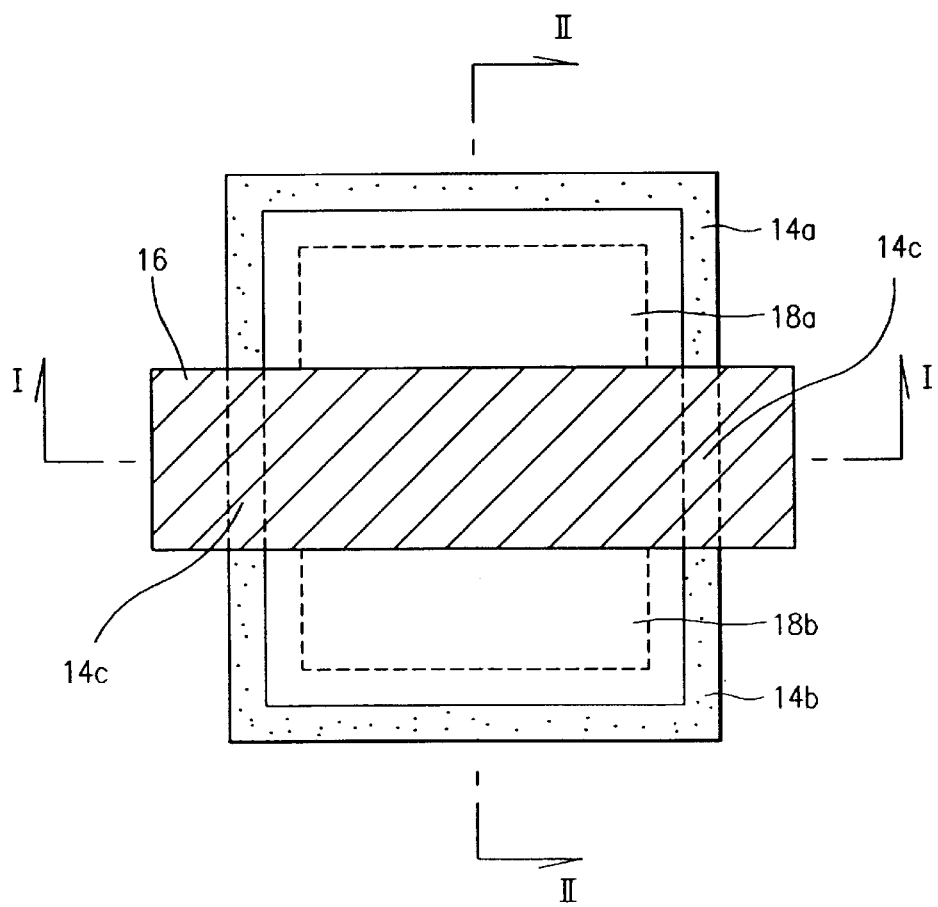
FIG. 2 is a layout of a preferred embodiment of a CMOS transistor of the present invention.
Figure 3:
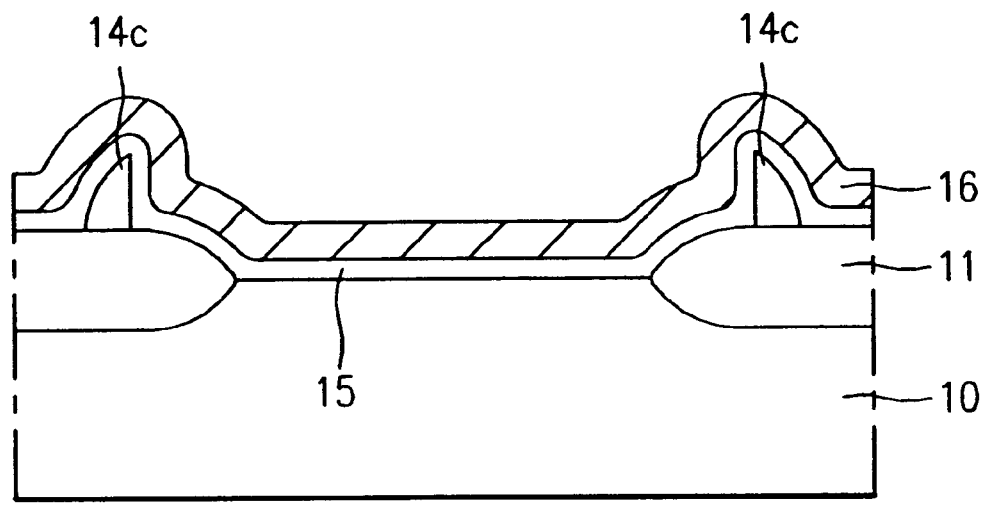
FIG. 3 is a sectional view of the CMOS transistor of the present invention along line I—I of FIG. 2.
Figure 4:
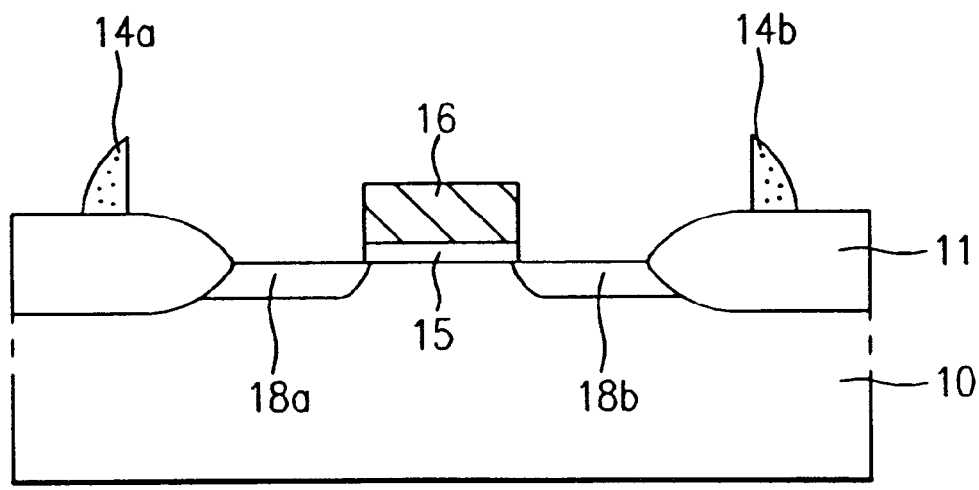
FIG. 4 is a sectional view of the CMOS transistor of the present invention along line II—II of FIG. 2.

Referring to FIGS. 2–4, which shows a CMOS transistor according to the present invention, an active region and a field region are defined on a first conductivity type semiconductor substrate 10 (FIG. 3). A field oxide layer 11 is formed on the field region of the semiconductor substrate 10 for electrical isolation of the active region from other adjacent active regions. A second conductivity type sidewall silicon layer 14 is formed in the form of a ring on the field oxide layer 11, surrounding the active region. The sidewall silicon layer 14 is spaced from the active region to prevent any electrical shorting. A gate oxide layer 15 and a common gate electrode 16 are formed with a same width on the active region in this order.

Two second conductivity type impurity regions 18a and 18b are formed in the active region at both sides of the common gate electrode 16, respectively, as shown in FIGS. 2 and 4. First conductivity type impurity regions 14a and 14b are formed in the sidewall silicon layer 14 at both sides of the common gate electrode 16 for isolating the impurity regions 14a and 14b from the second conductivity type impurity regions 18a and 18b. The impurity regions 14a and 14b also protrude from the field oxide layer 11, as shown in FIG. 4. Here, the first conductivity type impurity regions 14a and 14b form a PMOS TFT with the common gate electrode 16. The second conductivity type impurity regions 18a and 18b form an NMOS bulk transistor with the common gate electrode 16.

The active region 12 (see FIGS. 2 and 5a) includes the second conductivity type impurity regions 18a and 18b, and a channel region between them. The sidewall silicon layer 14 includes two first conductivity type impurity regions 14a and 14b, and two separated channel regions 14c. In FIG. 2, one of the two separated channel regions opposes the other. The two separated channel regions 14c symmetrically center the channel region in the active region 12. It is also possible to form only one channel region in the sidewall silicon layer 14. The common gate electrode 16 is formed on the channel in the active region as well as the two-channel regions in the sidewall silicon layer 14.

Accordingly, the active region includes the second conductivity type impurity regions 18a and 18b and a channel region between them. The silicon layer 14, in the form of a sidewall spacer, has two first conductivity impurity regions 14a and 14b and two channel regions 14c between them. Although there are two channel regions between the impurity regions 14a and 14b, the number of channel regions may be only one or more than two in accordance with the present invention.

Hereinafter, the method of manufacturing a CMOS device in accordance with the present invention will be described referring to FIGS. 5a to 5e and 6a to 6g.

Figure 5A:
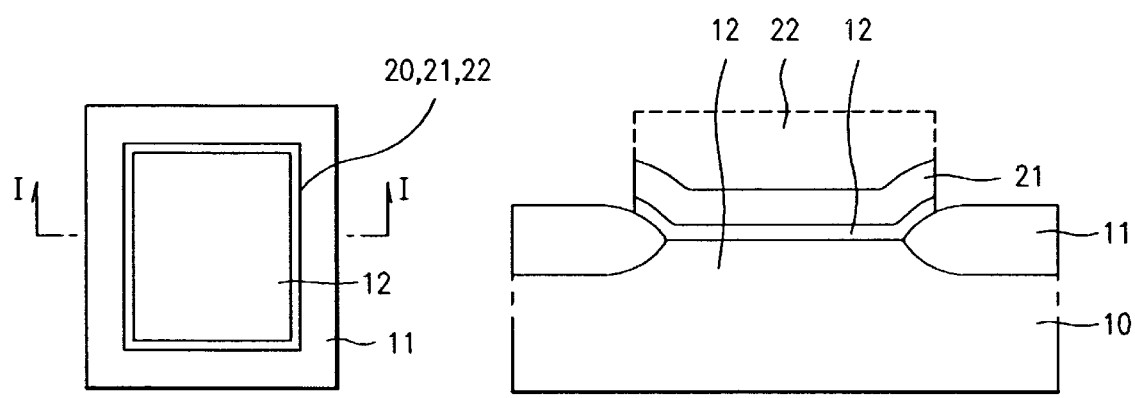
FIGS. 5A through 5E are sectional views of the CMOS transistor of the present invention along line of I—I of FIG.2.
Figure 6A:
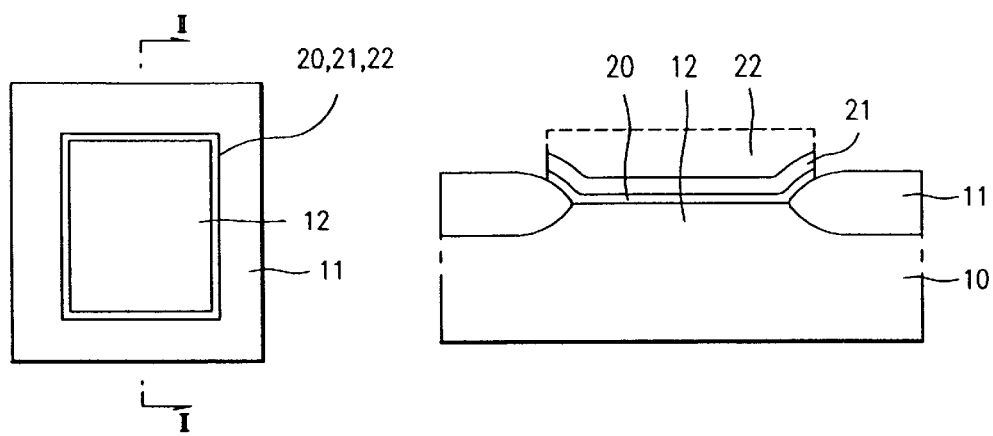
FIGS. 6A through 6G are sectional views of the CMOS transistor of the present invention along line of II—II of FIG. 2.

As illustrated in FIGS. 5a and 6a, a first conductivity type semiconductor substrate 10 is prepared and an active region 12 is defined on the substrate 10. A pad oxide layer 20 and a nitride layer 21 are deposited on the substrate 10 in this order. A photoresist layer 22 is coated on the deposited nitride layer 21. The photoresist layer 22 is patterned by an exposing and developing process to thereby selectively remove the nitride layer 21 and the pad oxide layer 20 on only the active region 12 using the patterned photoresist layer as a mask. The patterned photoresist layer 22 is removed. A field oxide layer 11 is formed by a heat treatment. The field oxide layer 11 serves to electrically isolate the active region 12 from other adjacent active regions (not shown).

Figure 5B:
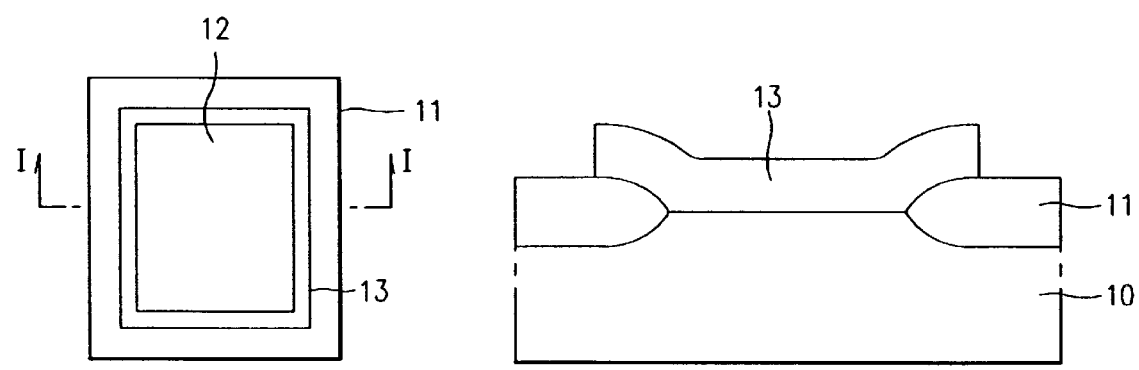
Figure 6B:
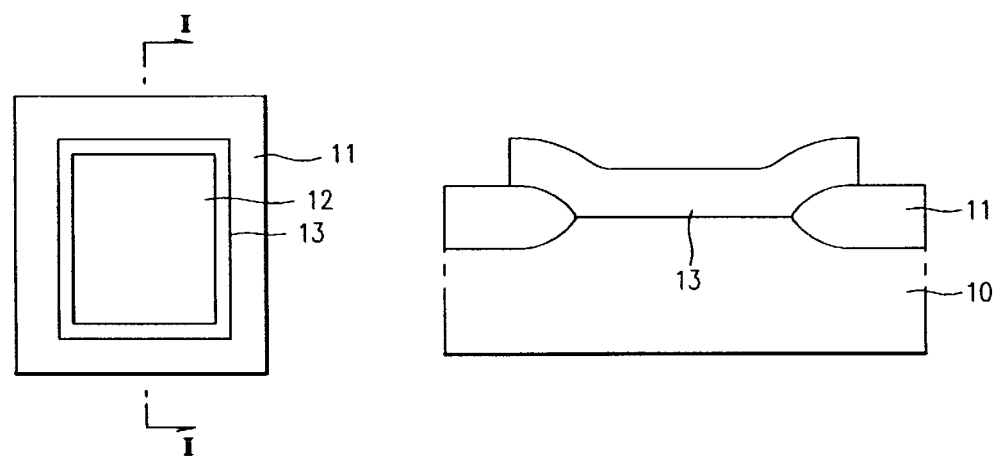

As illustrated in FIGS. 5b and 6b, the nitride layer 21 and the pad oxide layer 20 are removed. A silicon nitride layer 13 is deposited on the overall layer. A photoresist layer is coated on the silicon nitride layer 13. The photoresist layer is patterned by an exposing and developing process. The silicon nitride layer 13 is removed by performing an etching process the patterned photoresist layer as a mask, so that the silicon nitride layer 13 completely covers the active region and covers a predetermined portion of the field oxide layer 11.

Figure 5C:
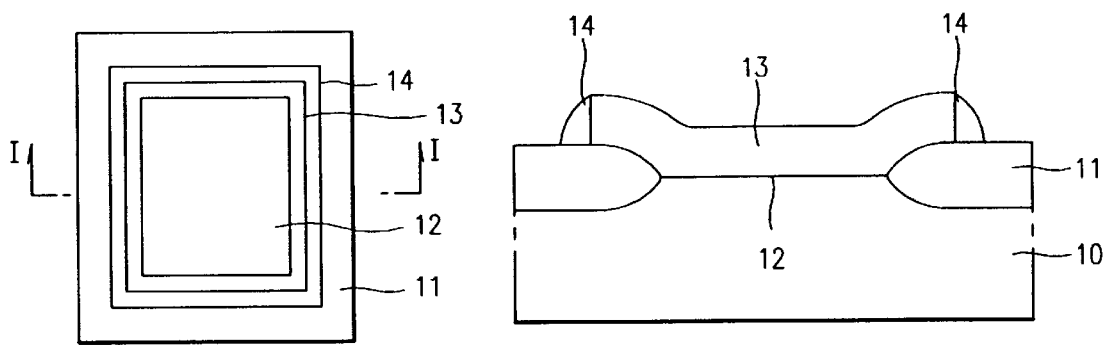
Figure 6C:
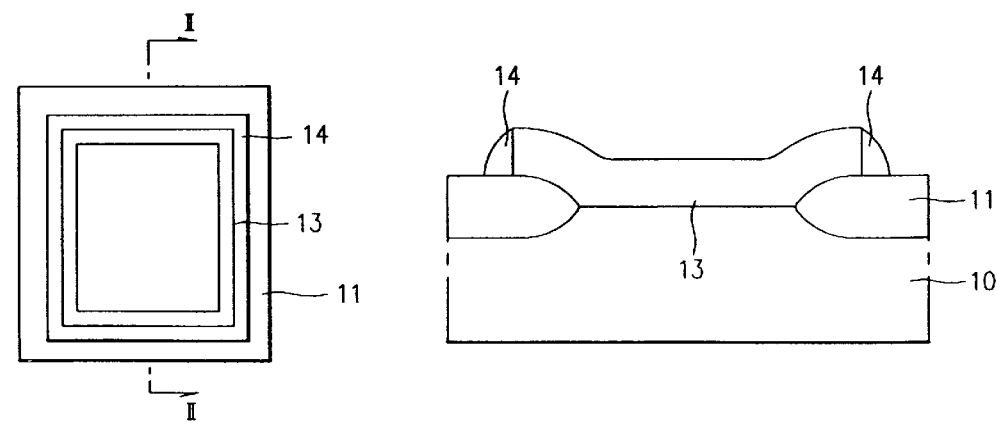

As illustrated in FIGS. 5c and 6c, an undoped polysilicon layer or an amorphous silicon layer is deposited on the overall surface of the silicon nitride layer 13 and the field oxide layer 11, and preferably blank-etched without a mask by a dry etching method (e.g., a reactive ion etching) to thereby form the sidewall silicon layer 14 at the side of the silicon nitride layer 13. The sidewall silicon layer 14 is used as the body of the TFT including a gate, a source, and a drain.

Figure 5D:
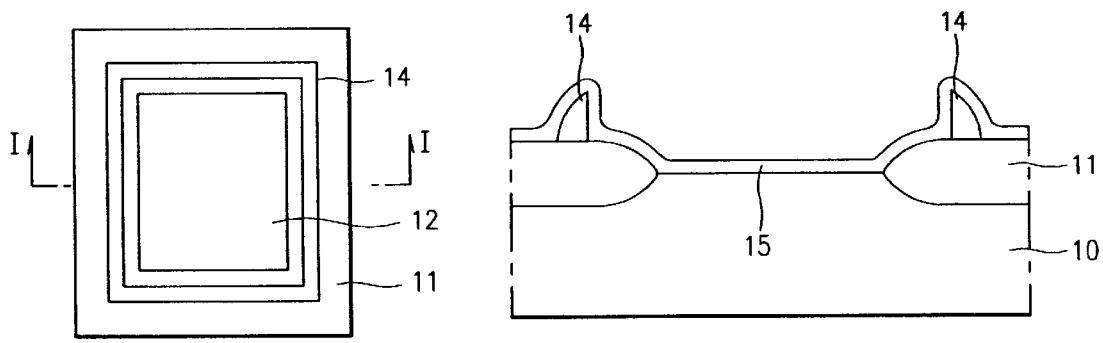
Figure 6D:
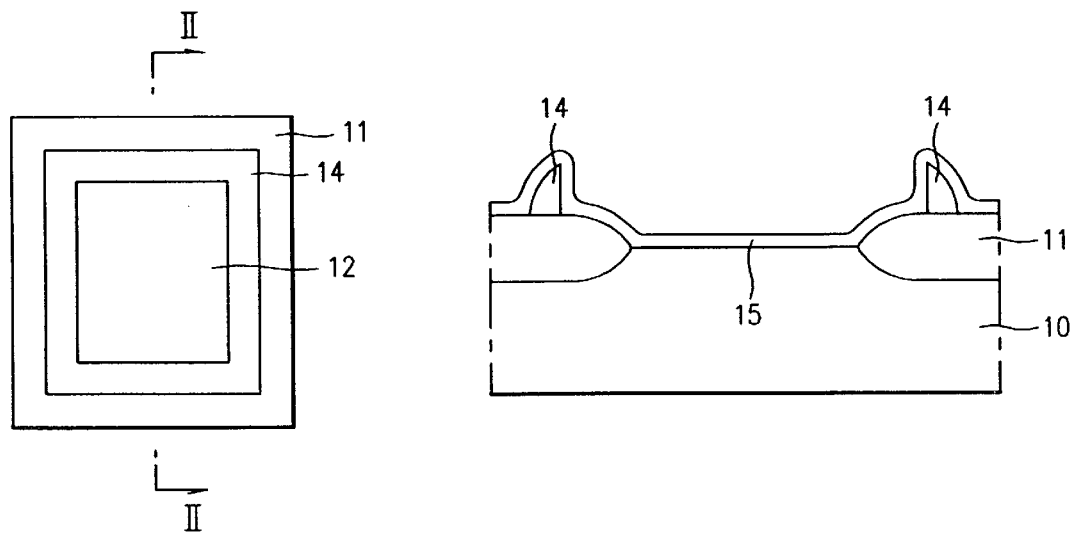

As illustrated in FIGS. 5d and 6d, the silicon nitride layer 13 is removed using a wet etch or a dry etch method after forming the sidewall silicon layer 14. Then, an oxide layer 15 serving as a gate insulation layer is deposited using a thermal oxidation or a chemical vapor deposition method.

Figure 5E:
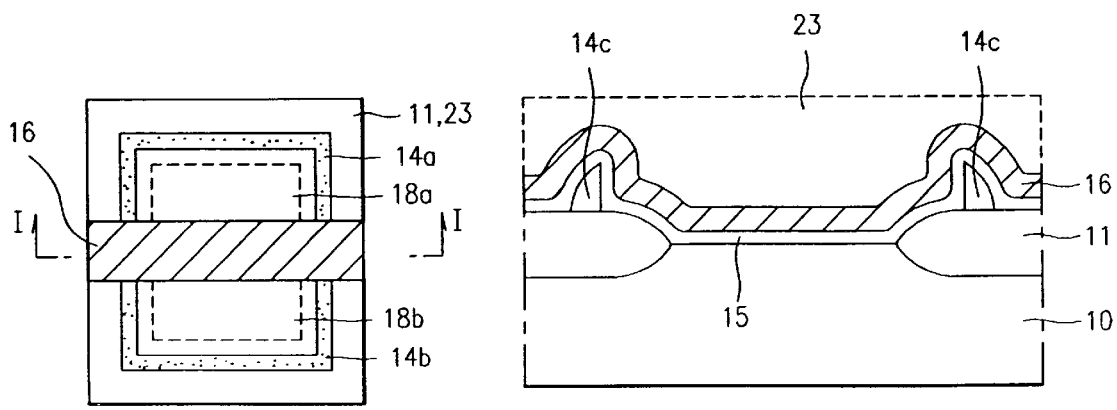
Figure 6E:
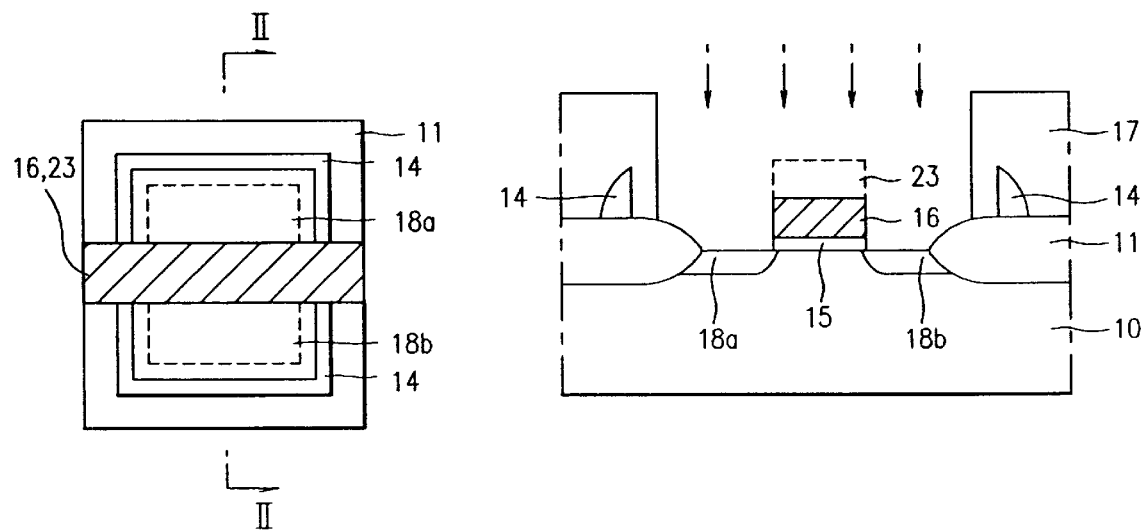

As illustrated in FIGS. 5e and 6e, an undoped polysilicon 16 (or amorphous silicon layer) is deposited on the overall surface of the oxide layer 15. A photoresist layer 23 is coated on the undoped polysilicon 16 (or amorphous silicon layer) and selectively patterned to be left in one direction on the sidewall silicon layer 14 and the active region 12 using the exposing and developing process. The undoped polysilicon layer 16 (or amorphous silicon layer) and oxide layer 15 are etched using the patterned photoresist layer 23 as a mask to thereby form a gate oxide layer 15 and a common gate electrode 16 (in one direction) on the active region 12 and the sidewall silicon layer 14. Then, the photoresist layer 23 is removed.

A photoresist layer 17 is coated on the overall-exposed surface, and patterned to remain only on a predetermined portion excluding the active region 12 using the exposure and development process. Second conductivity type impurity regions 18a and 18b (a source and a drain region of the bulk NMOS transistor, respectively) are formed by implanting impurity ions such as phosphorus (P) or arsenic (As) in the active region 12, using the patterned photoresist layer 17 and the common gate electrode 16 as a mask. Then, the photoresist layer 17 is removed.

Figure 6F:
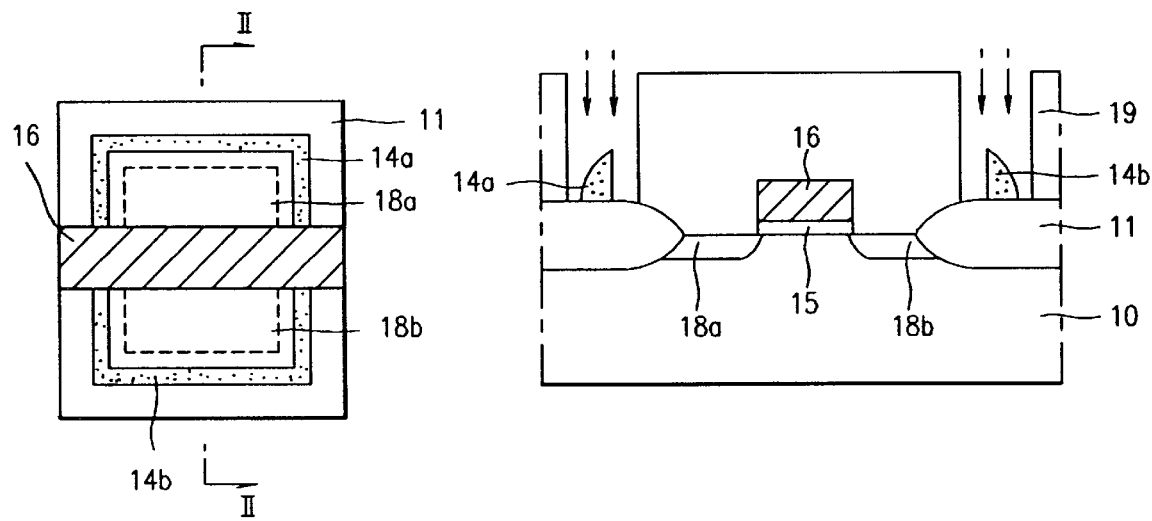

As illustrated in FIGS. 5e and 6f, a photoresist layer 19 is coated on the overall surface, and then patterned using the exposure and development process to expose two regions of the sidewall silicon layer 14 to be used as a channel of the PMOS TFT. Boron ions are implanted in the sidewall silicon layer 14 using the patterned photoresist layer 19 as a mask so that the first conductivity type impurity regions 14a and 14b are formed as the source and the drain of the PMOS TFT. In this embodiment, although the two regions of the sidewall silicon layer 14 are used, but only one region of the sidewall silicon layer 14 may be used as the channel region of the PMOS TFT.

Figure 6G:
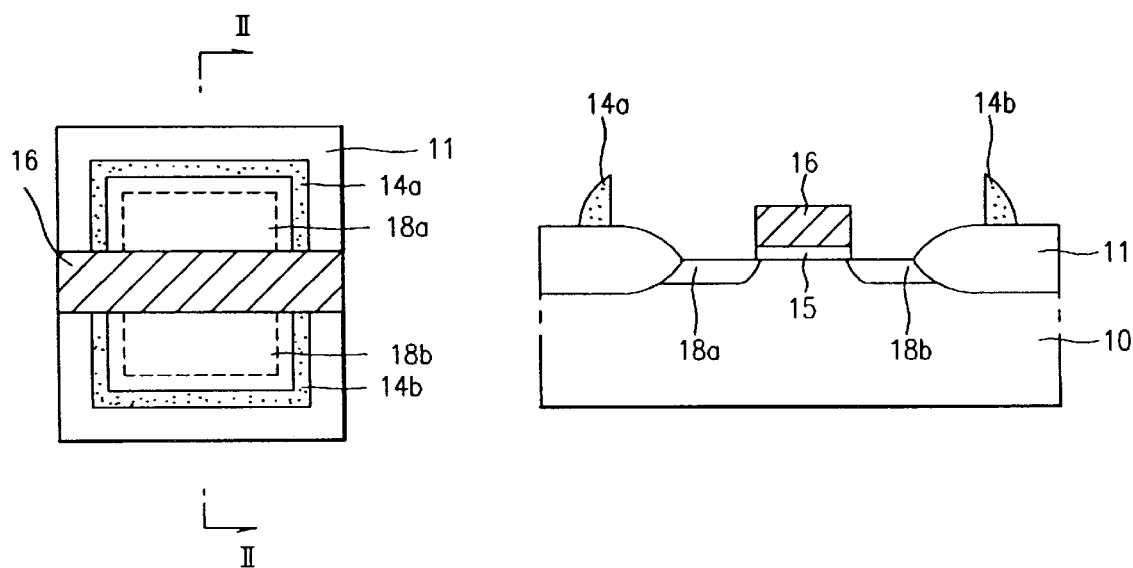

As illustrated in FIGS. 5e and 6g, the photoresist layer 19 is removed to complete the fabrication of the CMOS transistor according to the present invention.

The CMOS transistor and the method of manufacturing the same according to the present invention has advantages as follows.

First, the sidewall silicon layer 14 is used for the body of the PMOS TFT so that it is easy to control the width of the PMOS TFT.

Second, the gate electrodes of the NMOS bulk transistor and the PMOS TFT are formed in common, so that the process step is reduced, thereby increasing its productivity.

Third, there are two channels regions in the PMOS TFT, and the common gate electrode used as a gate of the PMOS TFT covers both two channel regions of the TFT, so that the turn-on/off characteristic of the CMOS transistor is enhanced.

It will be apparent to those skilled in the art that various modifications and variations can be made in the structure of the CMOS device and its fabrication method of the present invention without departing from the spirit or scope of the invention. Thus, it is intended that the present invention cover the modifications and variations of this invention provided they come within the scope of the appended claims and their equivalents.

What is claimed is:

1. A CMOS device comprising:
   a first conductivity type semiconductor substrate having an active region, the active region including two second conductivity type impurity regions and a first channel region between the two second conductivity type impurity regions;
   a field insulation region on the semiconductor substrate for electrical isolation of the active region from other adjacent active regions;
   a second conductivity type semiconductor layer only on the field insulation layer, the semiconductor layer including two first conductivity type impurity regions and a second channel region between the two first conductivity type impurity regions; and
   a gate electrode over the first channel region in the active region and the second channel region in the semiconductor layer.

2. The CMOS device according to claim 1, wherein the second conductivity type semiconductor layer has a ring-shape.

3. The CMOS device according to claim 1, wherein the two first conductivity type impurity regions in the semiconductor layer form a PMOS thin film transistor with the gate electrode.

4. The CMOS device according to claim 1, wherein the two second conductivity type impurity regions in the active region form an NMOS bulk transistor with the gate electrode.

5. The CMOS device according to claim 1, wherein the gate electrode is a common electrode for PMOS and NMOS transistors of the CMOS device.

6. The CMOS device according to claim 1, wherein the gate electrode, the first conductivity type impurity regions, and the second conductivity type impurity regions form a CMOS, the gate electrode being a common electrode.

7. A CMOS device comprising:
   a first conductivity type semiconductor substrate having an active region, the active region including two second conductivity type impurity regions and a first channel region between the two second conductivity type impurity regions;
   a field insulation region along an edge of the active region at a surface of the semiconductor substrate for electrical isolation of the active region from other adjacent active regions;
   a second conductivity type semiconductor layer only on the field insulation layer, the semiconductor layer being constantly spaced from the active region, and the semiconductor layer including two first conductivity type impurity regions and two separated channel regions; and
   a gate electrode over the two channel regions in the semiconductor layer and the channel region in the active region.

8. The CMOS device according to claim 7, wherein the two separated channel regions oppose each other.

9. The CMOS device according to claim 8, wherein the two separated channel regions are symmetric with respect to the channel region in the active region.

10. A CMOS device comprising:
    a first conductivity type semiconductor substrate having an active region;
    a field insulating layer on the first conductivity type semiconductor substrate;
    a second conductivity type semiconductor layer only on the field insulating layer, the second conductivity type semiconductor layer substantially surrounding the active region;
    a gate electrode over the active region and the second conductivity type semiconductor layer;
    second conductivity type impurity regions in the active region at sides of the gate electrode; and
    first conductivity type impurity regions in the second conductivity type semiconductor layer at sides of the gate electrode.

11. The CMOS device according to claim 10, wherein the second conductivity type semiconductor layer has a ring shape and the semiconductor layer overlaps the gate electrode at two regions corresponding to two channel regions, respectively.

12. The CMOS device according to claim 10, wherein
    the first conductivity type impurity region and the gate electrode form a PMOS thin film transistor,
    the second conductivity type impurity region and the gate electrode form an NMOS bulk transistor, and
    the gate electrode is a common electrode for the PMOS and NMOS transistors of the CMOS device.

* * * * *